United States Patent
Draxelmayr

(10) Patent No.: US 10,061,341 B2
(45) Date of Patent: Aug. 28, 2018

(54) DAC CONTROLLED LOW POWER HIGH OUTPUT CURRENT SOURCE

(71) Applicant: Infineon Technologies Austria AG, Villach (AT)

(72) Inventor: Dieter Draxelmayr, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/272,136

(22) Filed: Sep. 21, 2016

(65) Prior Publication Data

US 2018/0081386 A1    Mar. 22, 2018

(51) Int. Cl.
  *H03M 1/00* (2006.01)
  *G05F 3/26* (2006.01)
  *H03M 1/66* (2006.01)

(52) U.S. Cl.
  CPC .............. *G05F 3/267* (2013.01); *H03M 1/66* (2013.01)

(58) Field of Classification Search
  CPC .................................. G05F 3/267; H03M 1/66
  USPC .................................................. 341/135–144
  See application file for complete search history.

(56) References Cited

U.S. PATENT DOCUMENTS

| 6,163,283 A | 12/2000 | Schofield | |
|---|---|---|---|
| 9,678,111 B2 * | 6/2017 | Liu | H03K 3/011 |
| 2005/0122160 A1 * | 6/2005 | Abadeer | G05F 3/242 |
| | | | 327/538 |
| 2010/0237897 A1 * | 9/2010 | Kikuta | H02M 3/33507 |
| | | | 324/764.01 |
| 2010/0237898 A1 * | 9/2010 | Kikuta | H02M 1/32 |
| | | | 324/764.01 |
| 2011/0148681 A1 * | 6/2011 | Mao | H02M 3/33515 |
| | | | 341/153 |
| 2012/0286983 A1 * | 11/2012 | Pfann | H03M 1/66 |
| | | | 341/144 |
| 2014/0306768 A1 * | 10/2014 | Wang | H03F 3/45183 |
| | | | 330/297 |

OTHER PUBLICATIONS

Ascoli et al., "A Programmable and Low-EMI Integrated Half-Bridge Driver in BCD Technology," Design, Automation and Test in Europe, Mar. 10-14, 2008, 6 pp.
Lobsiger et al., "Closed-Loop di/dt and dv/dt IGBT Gate Driver," IEEE Transactions on Power Electronics, vol. 30, No. 6, Jun. 2015, 16 pp.
"EiceDRIVER Safe, High voltage gate driver IC with reinforced isolation," 1EDS-SRC Technical Description, Application Note, Industrial Power & Control, Infineon, Dec. 4, 2014, 24 pp.

(Continued)

Primary Examiner — Lam T Mai
(74) Attorney, Agent, or Firm — Shumaker & Sieffert, P.A.

(57) ABSTRACT

This disclosure describes a precise, fast, and relatively low power current-source for use in various applications, which may include driving power semiconductors such power MOSFETs and IGBTs. The current-source may provide both a constant current and a current profile over time which may charge and discharge the steering terminal (e.g. the gate) of a power semiconductor for precise control of switch timing. The current-source uses current steering digital-to-analog converter (DAC) technology and current mirrors to generate a high output current that is significantly immune to power supply and ground variability.

22 Claims, 7 Drawing Sheets

(56) References Cited

OTHER PUBLICATIONS

"EiceDRIVER Safe, High voltage gate driver IC with reinforced isolation," 1EDS-SRC, Target datasheet, Industrial Power & Control, Infineon, May 20, 2015, 33 pp.
"Bandgap voltage reference," Wikipedia, the free encyclopedia, retrieved on Jul. 6, 2016, 3 pp.
Haft-Baradaran, "Basic and advanced current references," retrieved from http://www.eecg.toronto.edu/~kphang/papers/2001/haft_ref.pdf on Jul. 6, 2016, 16 pp.
"Chapter 5: Testing Data Converters," Analog-Digital Conversion, 2005, 94 pp. (Applicant points out, in accordance ovith MPEP 609.04(a), that the year of publication, 2005, is sufficiently earlier than the effective U.S. filing date, Sep. 21, 2016, so that the particular month of publication is not in issue.).
"Chapter 10: Multi stage amplifier configurations," Analog Devices Wiki, Nov. 18, 2015, 11 pp.
Mercer, "Current Steering Digital-to-Analog Converters," Analog Devices Wiki, Sep. 16, 2014, 28 pp.
Najmabadi, "6. Cascode Amplifiers and Cascode Current Mirrors," ECE 102, 2012, 17 pp. (Applicant points out, in accordance with MPEP 609.04(a), that the year of publication, 2012, is sufficiently earlier than the effective U.S. filing date, Sep. 21, 2016, so that the particular month of publication is not in issue.).
Stock, "Galvanic Isolation: Purpose and Methodologies," http://www.allaboutcircuits.com/technical-articles/galvanic-isolation-Purpose-and-Methodologies/, Jan. 12, 2016, 5 pp.
"Unary coding," Wikipedia, the free encyclopedia, retrieved on Aug. 31, 2016, 4 pp.
"Power module," Wikipedia, the free encyclopedia, retrieved on Jul. 12, 2016, 3 pp.
Aboushady, "Current Mirrors," retrieved from http://www-soc.lip6.fr/~hassan/lec6_cur_mir.pdf on Sep. 21, 2016, 4 pp.
"Lecture 15, EE247," EECS 247 Lecture 15: Data Converters—DAC Design & Intro. to ADCs, 2010, 34 pp. (Applicant points out, in accordance with MPEP 609.04(a), that the year of publication, 2010, is sufficiently earlier than the effective U.S. filing date, Sep. 21, 2016, so that the particular month of publication is not in issue.).
"Lecture 16, EE247," EECS 247 Lecture 16: Data Converters, 2005, 33 pp. (Applicant points out, in accordance with MPEP 609.04(a), that the year of publication, 2005, is sufficiently earlier than the effective U.S. filing date, Sep. 21, 2016, so that the particular month of publication is not in issue.).
King, "Lecture #22," EECS40, 2003, 7 pp. (Applicant points out, in accordance with MPEP 609.04(a), that the year of publication, 2003, is sufficiently earlier than the effective U.S. filing date, Sep. 21, 2016, so that the particular month of publication is not in issue.).
Elias, "Class11: Transmission Gates, Latches," retrieved from http://www.engr.uky.edu/~elias/lectures/In_11.pdf on Aug. 30, 2016, 15 pp.
Nastase, "Mastering Electronics Design," retrieved from http://masteringelectronicsdesign.com/an-adc-and-dac-differential-non-linearity-dnl/ on Jun. 15, 2016, 10 pp.
"Chapter 4—Bipolar Junction Transistors," The Cascade Amplifier, retrieved from http://www.allaboutcircuits.com/textbook/semiconductors/chpt-4/cascode-amplifier/ on Jun. 15, 2016, 6 pp.
"Understanding Data Converters," Application Report, Texas Instruments, 1999, 22 pp. (Applicant points out, in accordance with MPEP 609.04(a), that the year of publication, 1999, is sufficiently earlier than the effective U.S. filing date, Sep. 21, 2016, so that the particular month of publication is not in issue.).
"Tutorial 4243, What is a Transmission Gate (Analog Switch)?," retrieved from https://www.maximintegrated.com/en/app-notes/index.mvp/id/4243 on Aug. 31, 2016, 5 pp.

\* cited by examiner

DAC CONTROLLED LOW POWER HIGH OUTPUT CURRENT SOURCE

TECHNICAL FIELD

The disclosure relates to integrated circuit current sources.

BACKGROUND

Power semiconductors may be used as switches to control loads such as lighting, motors, and other devices. Power semiconductors, such as metal-oxide-semiconductor field-effect transistor (power MOSFET) or insulated-gate bipolar transistors (IGBT), may be controlled by driving high or low voltages to a steering terminal (e.g. gate) of the power device. Controlling the gate of a power semiconductor may control the operation of the load.

SUMMARY

In general, this disclosure describes a precise, fast, and relatively low power current-source for use in various applications, which may include driving power semiconductors such power MOSFETs and IGBTs. Power semiconductors may be used as switches to control loads such as lighting, motors, DC-to-DC converter and other devices. The current-source may provide either a constant current or a current profile over time which may charge and discharge the steering terminal, such as the gate of a power semiconductor, for precise control of switch timing. The current-source uses current steering digital-to-analog converter (DAC) technology and current mirrors to generate a high output current that is significantly immune to power supply and ground variability.

In one example, the disclosure is directed to a system comprising a power module that includes a power module control input, and a current-source unit configured to deliver a signal to the power module control input. The current-source unit may comprise a digital to analog converter (DAC), the signal may comprise an electric current profile, and the electric current profile may control the output of the power module.

In another example, the disclosure is directed to a method that comprises receiving, by a DAC cell of a plurality of DAC cells, a DAC input current and a DAC control signal. In response to receiving the DAC control signal, the method may further include multiplying, by the DAC cell, the DAC input current, and outputting, by the DAC cell, a DAC output current comprising the multiplied DAC input current. The DAC cell may comprise a plurality of low voltage transistors protected by a high voltage transistor.

In another example, the disclosure is directed to a current-source circuit comprising a circuit output terminal including a circuit output voltage (Vg) and a circuit output current, and a reference current generation unit, wherein the reference current generation unit is configured to monitor the circuit output voltage (Vg). The current source circuit may also comprise a current-mirror unit, wherein the current-mirror unit receives a reference current from the reference current generation unit. In addition, the current-source circuit may also comprise a plurality of digital-to-analog converter (DAC) cells, wherein each DAC cell of the plurality of DAC cells: receives a DAC input current from the current-mirror unit, and outputs a DAC output current to the circuit output terminal. The current-source circuit may also include a DAC logic unit, wherein the DAC logic unit controls the DAC output current of each DAC cell of the plurality of DAC cells.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1A:
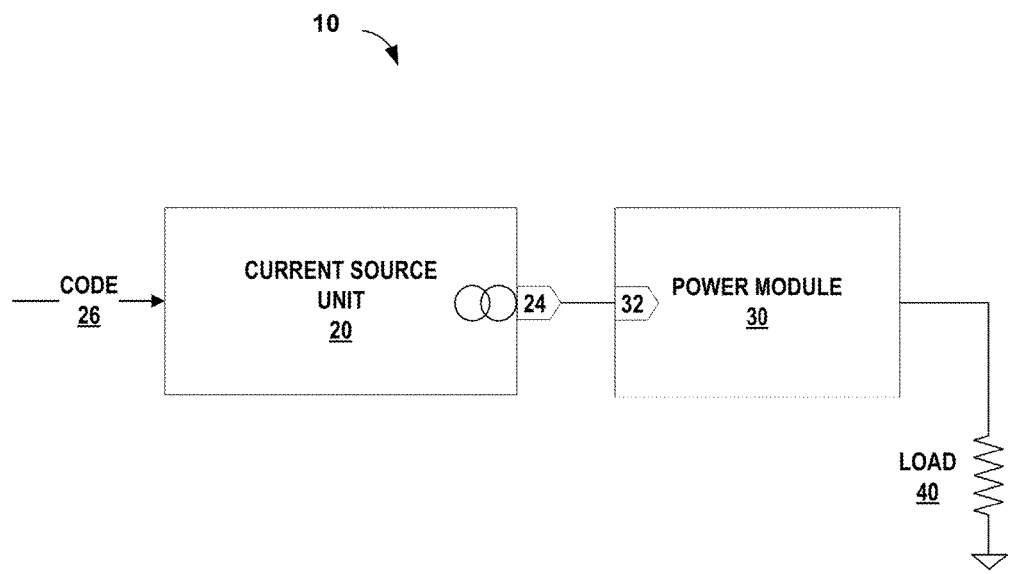
FIG. 1A is a block diagram illustrating an example system of a current-source controlled power module that supplies a load, in accordance with one or more techniques of this disclosure.

This disclosure describes a precise, fast, and relatively low power current-source for use in various applications, which may include driving power semiconductors such power MOSFETs and IGBTs. The current-source may provide both a constant current and a current profile over time which may charge and discharge the steering terminal (e.g. the gate) of a power semiconductor for precise control of switch timing. The current-source uses current steering digital-to-analog converter (DAC) technology and current mirrors to generate a high output current that is significantly immune to power supply and ground variability.

Applications for the current-source may include power modules containing an IGBT, but the techniques of this disclosure are not limited to modules that contain an IGBT. Other applications may include other kind of power transistors, such as modules with MOSFET or discrete power transistors with low current ratings. Other applications may also include servo drives, industrial drives, uninterruptible power supplies and three level inverters in many kinds of applications.

Power semiconductors may be used as switches to control loads such as lighting, motors, battery chargers, and other devices. One technique to control power semiconductors is by controlling the gate voltage. Applying a high or low voltage to the gate of a power semiconductor may turn on or off the power to the load. However, in some applications controlling the gate current may yield better control over switch timing. In some applications charging or discharging the gate of the power semiconductor with a current source may improve switch timing. Other applications may benefit by charging or discharging the gate with an electric current profile over time rather than simply a high or low current. One example technique to modifying voltage controlled switching to current controlled switching is to put a resistor in series. The resistor in series technique may not allow good control of the current.

Another control technique may include using stronger and weaker voltage switch components to influence the charging current to the gate of the power semiconductor. A first type of stronger/weaker voltage switch control may include two or more transistors in parallel. Turning one a first transistor delivers a first charging current. Turning on a second parallel transistor may deliver additional current. This type of configuration may include a plurality of transistors that may influence the charging current in discrete current levels. A further refinement may be, for example, to have three parallel transistors, each with different dimensions (e.g. width) and therefore different current carrying capacity. In this example, turning on the second transistor may not just double the current of the first transistor, but may increase the current by several times. The third transistor may be wider than the second, therefore turning on the third transistor may result in an increase in current proportional to the transistor width. In this example the third, widest, transistor may be considered a 'stronger' voltage switch, while the narrower transistor may be a 'weaker' switch. Examples of stronger/weaker voltages switches may not have precise control of the gate current.

Another solution may include a voltage controlled current source based on an operational amplifier (op-amp). An op-amp based solution may allow good control of the current, but an op-amp solution either may not be very fast or may consume quite a lot of power. Other solutions based on a digital-to-analog converter (DAC) may provide good current control, but not be well suited for applications that require higher currents because the solutions may not consider the higher voltage drops when using higher current. Some DAC based current sources able to handle higher currents may lack accuracy and may include an output mirror composed of high voltage devices, which may be slower and less accurate than low voltage devices.

A current-source, according to this disclosure, may use low voltage transistors. Low voltage transistors, may operate at less than five volts, however the terms "low voltage" and "high voltage" depends on the implementation characteristics of the techniques of this disclosure. For example, in some technologies, such as CMOS logic, a core transistor may be capable of handling one volt (1V) or less. In the example of a 1V transistor, then a "high voltage" component may be 1.8V or greater. For convenience, this disclosure may describe "low voltage" as less than five volts and "high voltage" as more than five volts. However, five volts is just one example for convenience and clarity. In other examples, other values may be considered, "low voltage." The actual value may depend on the process used to manufacture the components, such as those on an integrated circuit as well as the size (area) of the component.

Low voltage transistors may have advantages over higher voltage transistors because low voltage components may be small, fast, and accurate compared to those used in other current-sources for use with power modules. In some examples, the number of high voltage protection devices, capable of withstanding more than five volts, such as an output cascode transistor, may kept at a minimum to maintain the speed, size and accuracy advantages of low voltage components. Using a large number of high voltage devices instead of low voltage devices may have the disadvantage of a slow and big circuit. The current-source unit examples of this disclosure may start with a moderately low reference current that is multiplied up several times. The multiplied current is also distributed to allow local mirroring. Distributing the multiplied current may provide advantages by minimizing voltage drops and electrical current carrying capacity requirements of any one component or circuit path.

FIG. 1A is a block diagram illustrating an example system of a current-source controlled power module that supplies a load, in accordance with one or more techniques of this disclosure. Example system 10 may include a power module that supplies a load, such as lighting, motor or other similar loads. Other applications may include servo drives, industrial drives, uninterruptible power supplies and three level inverters.

System 10 may include power module 30, current-source unit 20 and load 40. Power module 30 may include gate 32. Current-source unit 20 may include output 24 and code input 26.

Power module 30 may be any type of power electronic module that provides the physical containment for power components, such as power semiconductor devices. Power module 30 may include an IGBT, power MOSFET or similar device. Gate 32 may include any kind of power module control input. In the example where power module 30 includes an IGBT or a MOSFET, gate 32 may be the gate of the IGBT or MOSFET. In the example where power module 30 includes a bipolar junction transistor (BJT), gate 32 may be the base of the BJT.

Current-source unit 20 may be configured to deliver a signal to the power module control input, such as gate 32 via output 24. Current-source unit 20 may provide a constant current or a current profile over time which may charge and discharge the steering terminal (e.g. gate 32) of power module 30 for precise control of switch timing. The signal from output 24 may include a current-source unit output voltage as well as an output current. The current-source output voltage is a function of the output load impedance and the current-source output current. The voltage from output 24 to gate 32 may be referred to as Vg. The signal to the power module may be an electric current profile, wherein the electric current profile controls the output of power module 30 and thereby controls the operation of load 40. In an example where load 40 is lighting, the signal from current-source unit 20 may control the pulse width modulation (PWM) period of a switched mode power supply (SWPS). A series of many PWM periods may control the brightness, timing and other aspects of lighting.

Current-source unit 20 may include code input 26 that controls the output current profile from output 24. In one example, code input 26 is a four-bit binary input code that allows sixteen possible settings. In other examples code input 26 contains more than four or less than four-bit binary code. For example, code input 26 may be five-bit binary input code scheme that may allow 32 possible settings. Other code schemes may include a four-line serial interface, a command word scheme or some other input scheme to control current-source unit 20. Some example input schemes may also include a decoding circuit specific to the input scheme.

Current-source unit 20 may include one or more digital to analog converter (DAC) cells that translate a digital code input into many different steady state current output levels, or a current profile over time. The current from output 24 to gate 32 may indirectly control the operation of load 40.

Figure 1B:
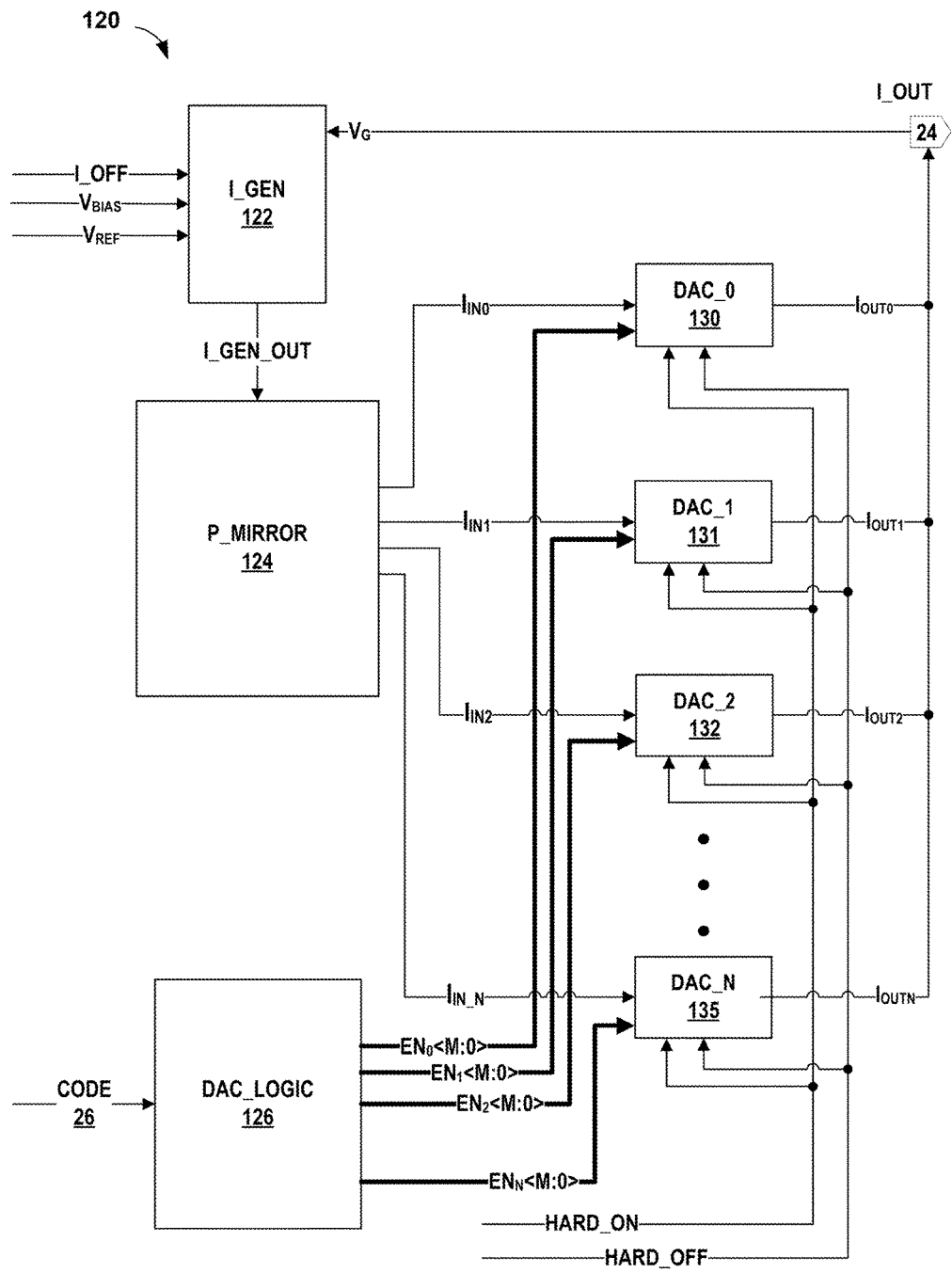
FIG. 1B is a conceptual schematic diagram illustrating an example current steering DAC current-source circuit in accordance with one or more techniques of this disclosure.

FIG. 1B is a conceptual schematic diagram illustrating an example current steering DAC current-source circuit in accordance with one or more techniques of this disclosure. Example current-source unit 120 is similar to current-source unit 20 shown in FIG. 1A and includes an output 24 and code input 26.

Example current-source unit 120 may be configured to deliver a signal to the power module control input, such as a power module control input or steering input via output 24. Current-source unit 120 may provide a constant current or a current profile over time which may charge and discharge the gate of a power module for precise control of switch timing, such as power module 30 shown in FIG. 1A. For simplicity and clarity, the description of FIG. 1B will discuss example current-source unit 120 in terms of controlling an IGBT. However, the current-source described by disclosure is not limited to controlling the gate of an IGBT.

Example current-source unit 120, as depicted by FIG. 1B may include I_gen unit 122, P_mirror unit 124, DAC_logic unit 126 and one or more DAC cells 130-135. Current-source unit 120 may also include additional inputs I_OFF, $V_{BIAS}$, and $V_{REF}$ as well as hard_on and hard_off inputs. The components of FIG. 1B will be explained in detail in FIGS. 2-4.

I_gen unit 122 is a reference current generation unit configured to monitor the current-source unit 120 output voltage (Vg) at output 24. Though not shown in FIG. 1B, output 24 may be connected to a power module control input, such as gate 32. I_gen unit 122 receives inputs I_OFF, $V_{BIAS}$, and $V_{REF}$. In response to receiving the off-current input (I_OFF) current-source unit 120 will deliver substantially zero output current from output 24. Inputs $V_{BIAS}$, and $V_{REF}$. I_gen unit 122 delivers a reference current, I_gen_out, to P_mirror unit 124.

P_mirror unit 124 is a current-mirror unit that receives as an input the reference current, I_gen_out from the reference current generation unit, I_gen 122. P_mirror unit 124 multiplies the input reference current and distributes the multiplied input reference current to a plurality of DAC cells 130-135. In one example, P_mirror unit 124 may multiply the reference current. As one example, P_mirror unit 124 may multiply the input by a factor of ten, though P_mirror unit 124 may multiply any other value such as twenty, sixteen or even divide by two. For example, where P_mirror multiplies by 10, when I_gen_out=100 µA, P_mirror unit 124 may deliver N mirrored output currents, with each output current $I_{IN0}$-$I_{IN\_N}$=1.0 mA. P_mirror unit 124 may be configured to multiply and distribute value of output current, either an increase or decrease from the input reference current I_gen_out. P_mirror unit 124 may be configured as a local mirror arrangement which may have an advantages over distributed mirroring or other mirror schemes because local mirroring may provide good current matching. In other words, each multiplied output current will be approximately equal to the other multiplied output currents. The multiplied output currents will be approximately equal within manufacturing and component tolerances.

In the example of FIG. 1B, DAC cells 130-135 may also be named DAC_0-DAC_N. Each DAC cell of the plurality of DAC cells may receive a DAC input current ($I_{IN\_N}$) from the current-mirror unit, P_mirror unit 124. In the example of FIG. 1B, DAC_0, 130, receives $I_{IN0}$, DAC 1, 131, receives $I_{IN1}$, DAC_2, 132, receives $I_{IN2}$, and DAC_N, 135, receives $I_{IN\_N}$. Each DAC cell 130-135 may output a DAC output current to output 24. Output 24 may be connected to the power module control input, such as gate 32. Each DAC cell may output a different current level to output 24. The plurality of current levels output from each DAC cell may be combined at output 24 into the current-source unit 120 output current. However, current-source unit 120 may be configured to balance the current among the plurality of DAC cells so that the DAC output current is approximately equal within the resolution of the DAC control signals.

Each DAC cell may receive a DAC control signal ($EN_0$-$EN_N$), which is an output from DAC_logic unit 126. In the example of FIG. 1B, each DAC control signal includes M+1 different lines (M:0) with unary or digital thermometer encoding. In this example, M+1 lines will yield M+2 states because "no line active" is a valid state. In this example, with N+1 DAC cells (DAC_0-DAC_N), the control signal resolution will be (N+1)*(M+2). The number of lines may be any value such as M=2, M=12, M=20 and may depend on the size of the circuit and how finely tuned the DAC output value resolution will be. More lines may allow a finer resolution, but at higher cost and larger size. The number of lines may also depend on the number of bits or type of encoding. In the example of 4-bit encoding, only 16 levels are possible. Therefore, for 4-bit unary encoding, only 15 lines may be used (14:0), or $EN_{14}$ to $EN_0$, to get sixteen levels. In other examples, a different encoding, such as binary or 1-hot-encoding may result in a different resolution value. That is, with 1-hot-encoding, the 'no lines active' is not a valid state, yielding M+1 states for M+1 lines. DAC cell operation will be discussed in more detail in FIGS. 4A-4C.

The DAC_logic unit 126 is a piece of logic, steering the appropriate switches in the DAC cells. DAC_logic unit 126 may be implemented as discrete logic components, as a portion of an integrated circuit, an application specific integrated circuit (ASIC), or with similar techniques. In an example with fifteen output lines, M=15, e.g. (15:0) and eight DAC cells, such as DAC_0-DAC_7, current-source unit 120 may output (N+1)*(M+1)=8*16=128 possible current settings. For example, one scheme may include four input lines that each line controls a current source, which may result in five possible settings (i.e. ranging from all current sources OFF to all ON).

In some examples DAC_logic unit 126 may have a binary coded input that can select less than the total number of possible current settings. For the previous example with 128 possible current settings, a binary coded input to DAC_logic unit 126 would require at least seven input lines ($2^7$=128). For the example described above, five input lines in a binary scheme may allow for only $2^5$=32 settings. In the five input line example, the output current may be activated in a piecewise exponential way or some other manner. In one example of a piecewise exponential technique, lower codes, e.g. codes between 00000 and 01000 (or 0x00-0x10) may drive individual current sources. Higher codes, e.g. codes>10000, may drive multiple current sources. Intermediate codes may drive some intermediate number of current sources. In such an example, at higher codes the step size change of current level may be greater than the step size of the current at lower codes. The codes may be configured in a way that all DAC cells carry approximately the same amount of current. This helps in keeping the current balanced throughout current-source unit 120.

Each DAC cell may also include a hard_off and a hard_on input. When a DAC cell receives the hard_off, each DAC cell 130-135 will output substantially zero current. Therefore, output 24 will deliver substantially zero current (I_OUT=0). I_OUT will be substantially zero within manufacturing and component tolerances. The hard_off input has a similar effect to the I_OFF input. The difference is the I_OFF input turns off the reference current I_gen_out while the hard_off input turns off the DAC cells. When a DAC cell receives the hard_on input, each DAC cell will output the maximum current and output 24 will receive the maximum output current. In the example of FIG. 1B, and also explained further in the figures below, the hard_on input may set a low-ohmic connection to the supply. The current, in this example would therefore no longer be a controlled current.

Figure 2:
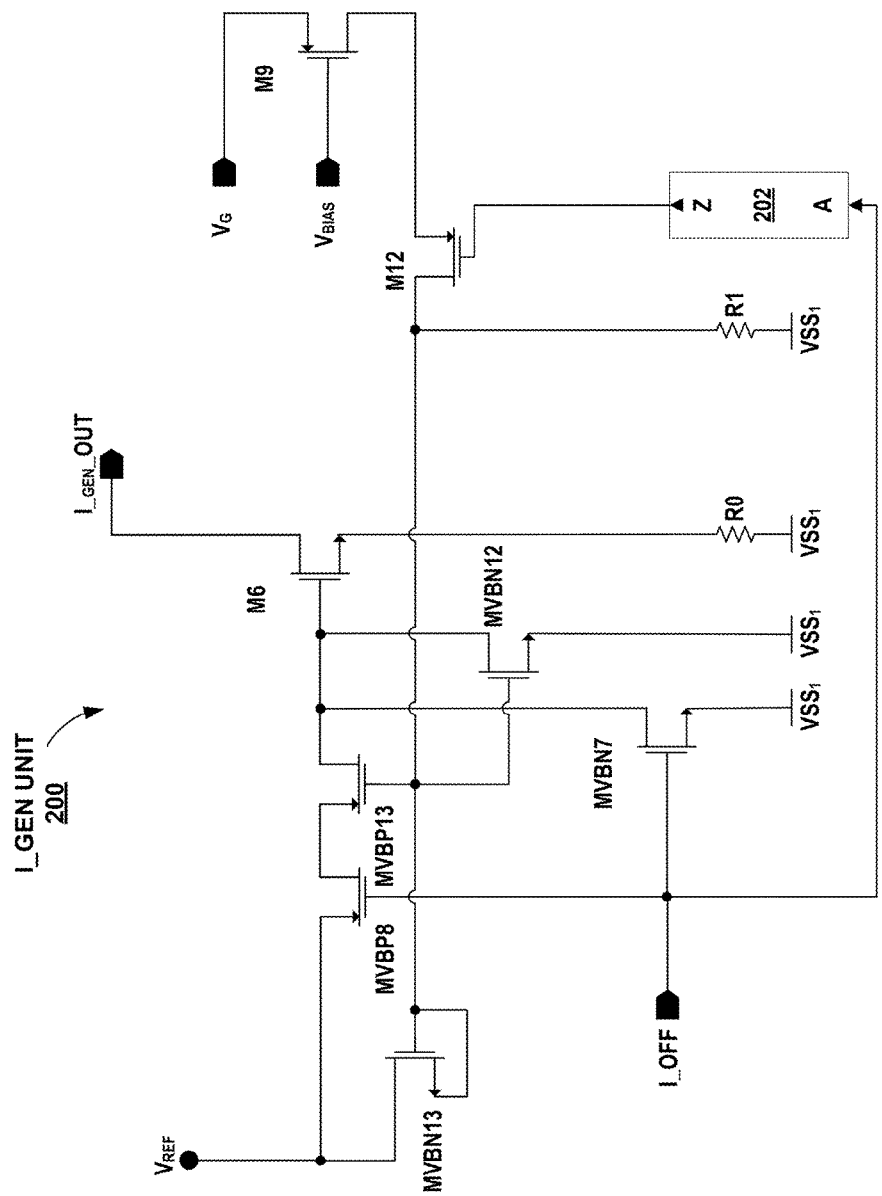
FIG. 2 is a conceptual schematic and block diagram illustrating further details of one example implementation of a reference current generation unit.

FIG. 2 is a conceptual schematic and block diagram illustrating further details of one example implementation of a reference current generation unit. Example I_gen unit 200 performs the same functions as I_gen unit 122 depicted by FIG. 1B. As with I_gen unit 122, I_gen unit 200 includes inputs for I_OFF, $V_{BIAS}$, and $V_{REF}$ and delivers a reference current output I_gen_OUT. There are many possible configurations to output a reference current output. The example of I_GEN unit 200 depicted by FIG. 2 is just one possible implementation. I_gen unit 200 may include low voltage transistors, which may be small, fast, and accurate compared to those used in other current-sources.

$V_{REF}$ connects to both the source of p-channel transistor MVBP8 and the drain of transistor MVBN13. The drain of MVBP8 connects to the source of MVBP13, while the drain of MVBP13 connects to the gate of M6, in the example of FIG. 2. The drains of both MVBN12 and MVBN7 also both connect to the gate of n-channel transistor M6. The source of M6 connects to ground through resistor R0 and the drain of M6 is the output I_gen_OUT.

In the example of FIG. 2, the "ground" is shown as VSS1. The current-source unit may have more than one level of ground. Throughout this disclosure, the ground may be labeled as VSS1, VSS2, VSS3, and so on to differentiate between the various ground levels. The value of VSS1, for example may be zero, while VSS2 may be five volts, ten volts, or 13.5 volts, etc. Throughout this disclosure all ground points or terminals labeled with VSS1 have approximately the same level as all other points labeled VSS1. Similarly, all ground points labeled with VSS2 are approximately the same as all other points labeled VS S2, where "approximately the same" means equal within manufacturing and component tolerances. Where appropriate, this will be explained in more detail for the below figures.

The gate of MVBN13 connects to ground (VSS1) through resistor R1, to the drain of M12, and the gates of both MVBP13 and MVBN12. I_OFF connects to the gates of MVBP8, MVBN7 and the input A of level shifter 202. The output Z of level shifter 202 connects to the gate of M12. The source of M12 connects to the drain of M9, while the source of M9 monitors the current-source unit output voltage Vg and the gate of M9 connects to $V_{BIAS}$.

In operation, this disclosure describes the current-source unit output connected to the gate of a power transistor for convenience and clarity. However, the current-source unit may be connected to other devices, as described above.

The Vg input monitors the output voltage of the current-source and may provide a specific regulation mechanism. When a constant current drives a capacitive load, such as the gate of an IGBT, at some point the capacitive load is full. In other words, the capacitive load's full supply voltage has been built up. Trying to drive additional current through a full capacitor simply consumes power but with no additional benefit. In other words, when the capacitive load at output 24 is 'full' then the current-source unit will not be able to drive additional current through it. However, the components within the current-source unit may continue to function and consume current. Therefore, example I_gen unit 200 depicted in FIG. 2, is configured to keep the circuitry within current-source unit active or "alive" but at the same time reduce current. In the example of I_gen unit 200, Vg senses the gate voltage. If the circuit recognizes that Vg indicates the capacitive load is "close to full" the circuit reduces all the internal currents to save power. In some examples, "full" may be described as "saturated." In other words, the reference current generation unit, I_gen 200 is configured to reduce the reference current I_gen_OUT in response to the current-source output voltage Vg (at output 24) exceeding an output voltage threshold.

In the example of I_gen unit 200 if Vg is sufficiently high then M9 begins to conduct. The value of the output voltage threshold depends on the desired application. Once Vg exceeds the output voltage threshold, the Vg signal can propagate to MVBP13 and MVBN12. This lowers the gate of M6, and therefore it reduces the reference current I_gen_OUT. This in turn reduces all the internal currents from P_mirror unit 124 and therefore also lowers all the DAC output currents from DAC cells 130-0135. If Vg is sufficiently high, this may turn off I_gen_OUT completely. Note that in the example of FIG. 2, if the circuit of I_gen unit 200 is in off state, then the Vg signal will not propagate to MVBP13 and MVBN12. The I_OFF input, in the example of FIG. 2, may turn off the reference current output I_gen_OUT.

Level shifter 202 may change the voltage domain of an input from one set of values to a higher or lower set of values. As one possible example, the voltage to input A of level shifter 202 may operate in the zero to 5 volt [0V-5V] range. Level shifter 202 may translate the input A to a higher voltage domain, such as ten to fifteen volt [10 V-15V] range. In the example of FIG. 2, I_OFF may be a "low voltage" signal while M12, which responds to the current-source unit output voltage Vg, may operate at "high voltage." Level shifter 202, in this example, translates or converts the low voltage signal from input I_OFF to a high voltage domain.

Figure 3:
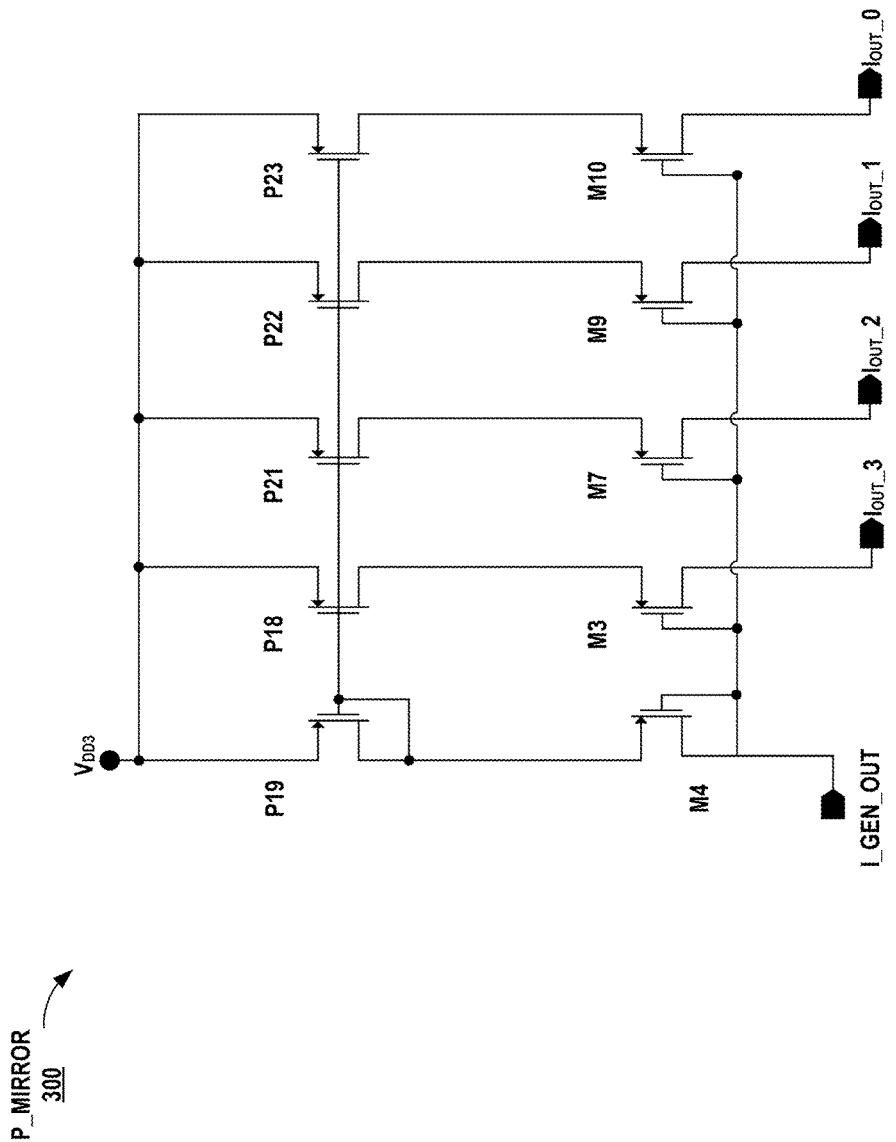
FIG. 3 is a schematic diagram illustrating an example multi-output current mirror unit in accordance with one or more techniques of this disclosure.

FIG. 3 is a schematic diagram illustrating an example multi-output current mirror unit in accordance with one or more techniques of this disclosure. Example P_mirror unit 300 is analogous to P_mirror unit 124 depicted in FIG. 1B and performs the same current multiplication and distribution functions described above.

The example implementation of P_mirror unit 300 of FIG. 3 generates four replicas of the incoming current I_gen_OUT. Each of these currents ($I_{OUT\_}0$-$I_{OUT\_}3$) serves as a DAC input current for the individual DAC cells. The number four is a just one possible example implementation. In other examples P_mirror 300 may include more than four or less than four replicas. For example, a circuit with eight current mirror replicas would multiply currents by a factor of eight, which may provide a reasonable compromise in terms of speed. However, other examples, such as twelve, sixteen, twenty and so on may provide advantages, depending on the application. The individual DAC cell dimensions and currents through each DAC cell can be smaller with more DAC cells available. Therefore, within a DAC cell, the voltage drops, that may cause a mismatch, and the distance between individual elements can be kept smaller. However, more cells also could consume more area because of splitting and isolation spacing between devices needed for proper operation on an integrated circuit.

The components that generate $I_{OUT\_}0$ from I_gen_OUT include P23 and M10. The source of P23 connects to VDD3 and the drain of P23 connects to the source of M10. The drain of M10 is $I_{OUT\_}0$. The other mirror output currents ($I_{OUT\_}1$-$I_{OUT\_}3$) use the same components connected in the same manner as $I_{OUT}\_0$. Note that FIG. 3 depicts four current mirrors for convenience. Other examples may implement more or fewer mirrors, as described above.

The components that generate $I_{OUT}\_1$ from I_gen_OUT are P22 and M9. The source of P22 connects to VDD3 and the drain of P22 connects to M9. The drain of M9 is $I_{OUT}\_1$.

The components that generate $I_{OUT}\_2$ from I_gen_OUT are P21 and M7. The source of P21 connects to VDD3 and the drain of P21 connects to the source of M7. The drain of M7 is $I_{OUT}\_2$.

The components that generate $I_{OUT}\_3$ from I_gen_OUT are P18 and M3. The source of P18 connects to VDD3 and the drain of P18 connects to the source of M3. The drain of M3 is $I_{OUT}\_3$.

To complete the mirror configuration, the gate and drain of P19 connects to the source of M4 and the gates of P18, P21, P22, and P23. The input I_gen_OUT, which comes from the I_gen unit, connects to the drain and gate of M4 and the gates of each of M3, M7, M9, and M10.

In the example of FIG. 3, P_mirror unit 300 distributes the multiplied input current. The multiplication factor can be unity (a factor of 1) or some other factor. Choosing the size and capacity of the components selects the degree of multiplication. In one example, P_mirror unit 300 may multiply the input current by ten. For example, if I_gen_OUT is 1.0 mA, then each current ($I_{OUT}\_0$-$I_{OUT}\_N$) will be 10.0 mA. Choosing different component characteristics may change the multiplication factor. For example, each output current could be twelve or twenty times the input current. In other examples P_mirror 300 may divide the input current by a factor, such as divide by two. Also in the DAC cells local mirroring is used to further increase local copies of each reference current by a multiplication factor. The local mirroring in the DAC cells will be explained further in FIGS. 4A-4C below.

All transistors in the example of P_mirror 300 may be low voltage transistors. In some examples transistors P19-P23 may be low voltage transistors while transistors M4-M10 may be high voltage transistors. Transistors M4-M10 may serve as protection for the low voltage transistors P19-P23 in the examples where the difference between the terminal voltage of VDD3 and any of the $I_{OUT}$ terminals is high enough to damage low voltage transistors P19-P23. In other examples, each current mirror element may include one or more additional transistors connected in a cascode arrangement, not shown in FIG. 3. In this disclosure a current mirror element may also be referred to as a transistor stack. The one or more cascode transistors may provide additional protection between high voltage and low voltage portions of the circuit.

Figure 4A:
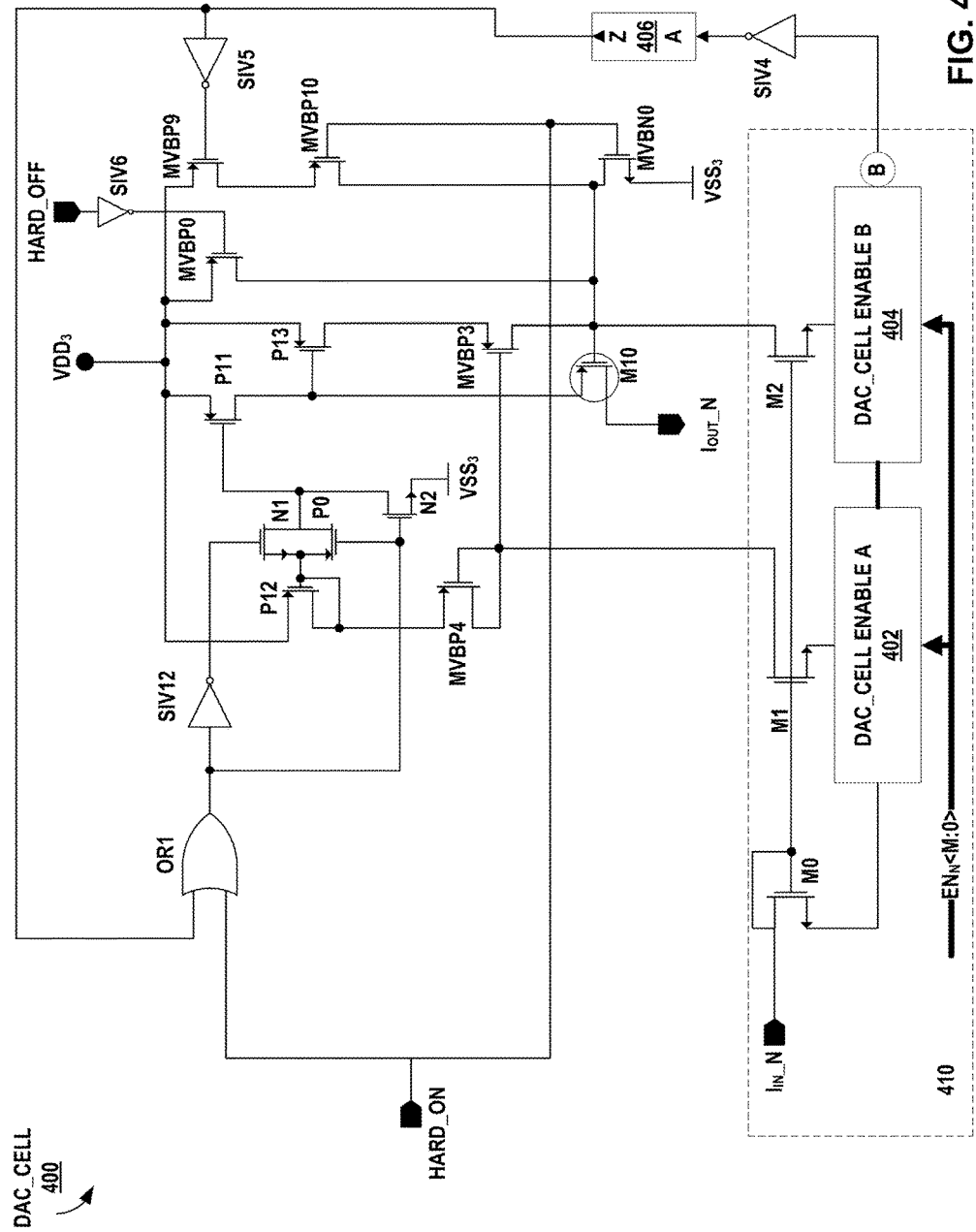
FIG. 4A is a conceptual and schematic block diagram illustrating an example digital-to-analog converter (DAC) cell in accordance with one or more techniques of this disclosure.

FIG. 4A is a conceptual schematic and block diagram illustrating an example DAC cell in accordance with one or more techniques of this disclosure. Example DAC cell 400 is similar to any of DAC_0-DAC_N (130-135) depicted in FIG. 1B, with the same functions, inputs and outputs. Throughout this disclosure some example circuits may include additional components for electro-static discharge (ESD) protection, electromagnetic interference (EMI) protection, protection from power supply ripple and other purposes that may not be shown in the examples for clarity and to focus on the techniques of this disclosure.

DAC cell 400 may receive a DAC input current ($I_{IN}\_N$) from the current-mirror unit, such as P_mirror unit 124 and output a DAC output current ($I_{OUT}\_N$) to the current-source unit output, such as output 24. Each DAC cell may output a different current level or a current level that is approximately equal to other DAC cells. DAC cell 400 may receive a DAC control signal ($EN_N$) from a DAC_logic unit, such as DAC_logic unit 126. DAC cell 400 may also include a hard_off and hard_on inputs, with the same functions as described above.

The example DAC cell 400 depicted by FIG. 4A is only one example implementation of a DAC cell. Other examples may include implementing by using discrete components instead of an integrated circuit, a different circuit arrangement, using a field programmable gate array (FPGA) or similar component. For example, throughout this disclosure, the circuits shown may switch PMOS and NMOS and reverse the VDD with ground or VSS to achieve the same functions described here.

The hard_on input connects to the gates of MVBN0 and MVBP10, as well as one input of OR1. The other input of OR1 receives the signal from output Z of level shifter 406, which also connects to the input of inverter SIV5. The output of OR1 drives the gates of P0 and N2 and connects to the input of inverter SIV12. The output of SIV12 drives the gate of N1. The drain of N1 connects to the drain of P0, while the source of N1 connects to the source of P0. In operation, the transistors N1 and P0 form a transmission gate, which may also be called a t-gate. SIV12 drives the gate of N1 complementary (opposite) to the gate of P0. Either both transistors are on or both are off. This t-gate structure is for isolation.

Both the drain of P0 and drain of N1 connect to the drain of N2 as well as the gate of the low voltage transistor P11. The source of N2 connects to VSS3, one of the ground connections. VSS3 may be different than VSS1 or VSS2, but VSS3 is approximately the same as all other terminals labeled with VSS3. VSS3 may be at a value higher than VSS1. For example, if VSS1 is zero volts, VSS3 may be approximately 10V, 13.5V, 15V, or some other value. As described above, approximately equal indicates the values may be the same, within manufacturing and component tolerances.

P12 is the other side of the current mirror from P11. The gate of P12 connects to the sources of P0 and N1 as well as the drain of P12 and the source of MVBP4. The source of P12 connects to the sources of P11, P13, MVBP0 and MVBP9 and to VDD3. The drain of P11 connects to the gate of P13 and the source of the high voltage transistor M10, which is configured as a regulated cascode. The drain of P13 connects to the source of MVBP3. The gate of MVBP3 connects to the drain and gate of MVBP4 and the drain of M1.

The gate of transistor M10 connects to the drains of MVBN0, MVBP10, MVBP0, M2 and MVBP3. The source of MVBN0 connects to VSS3, while the drain connects to the drain of MVBP10. The source of MVBP10 connects to the drain of MVBP9.

The HARD_OFF input drives the gate of MVBP0 through inverter SIV6. In operation, HARD_OFF turns off high voltage transistor M10 through MVBP0.

The transistors M0, M1 and M2 serve as cascodes and as high voltage protection devices. The drain of M0 is the $I_{IN}\_N$ input to DAC cell 400 and connects to the gate of M0. The gate of M0 connects to both gates of M1 and M2. The source of M0 connects to DAC_Cell enable unit A (402) as does the source of M1. The source of M2 connects to DAC_cell enable unit B (404). DAC cell enable unit A (402) and DAC_cell enable unit B (404) each receive DAC control signal $EN_N$. DAC_cell enable unit B also outputs a signal to level shifter 406 through inverter SIV4. Further details on the configuration of DAC_cell enable unit A and DAC_cell enable unit B will be described below in FIGS. 4B and 4C.

The two main functions of DAC cell 400 may be divided into the current switching arrangement 410 and the output driver. Current switching arrangement 410 includes the inputs of $I_{IN\_N}$ and $EN_N$, as well as DAC_cell enable unit A (402), DAC_cell enable unit B (404), M0, M1 and M2. The output driver portion is everything outside of current switching arrangement 410. The output driver is a current mirror with regulated cascode which multiplies the input current by a value that depends on the size ratio of P11 and P12. For example, the ratio of P11/P12=10, the output current would be ten times the input current. In other examples, the multiplication factor may be two, twenty or any other value depending on the ratio of P11/P12. DAC cell 400, as shown, combines low voltage transistors (for small area and high speed) with the high voltage regulated cascode transistor M10 used as a high voltage protection device.

In operation, the output driver has three states: Hard on, hard off, and controllable current drive. Hard on and hard off states have been described above. Hard on may also be described as a low-ohmic connection to the positive supply. In the example of FIG. 4A, this is realized by pulling the gates of P11 and M10 low. Hard off may be described as connecting the gate of the output PMOS M10 low-ohmic to VDD3. When in a controllable current drive state, the DAC output current $I_{OUT}\_N$ depends on the settings of the DAC control signals $EN_N$.

In the output driver portion, while in the controllable current drive state, P12 and P11 form a multiplying current mirror with a multiplication factor of 20 for example, where the ratio of P11/P12=20. Choosing different component values may result in a different multiplication factor. The components connected between transistors P12 and P11 is for the "hard on" feature. The "hard on" components include P0, N1 and N2 in the example of FIG. 4A.

Transistor M10 serves as a regulated cascode. The purpose of P13 is to regulate the drain voltage of P11 to the same value as the drain voltage of P12 for a better current matching. A regulation loop works via the regulation transistor P13 which senses the drain voltage of P11 and regulates M10 in a way to force the correct drain voltage at P11 for current matching between P11 and P12. MVBP3 is configured as a cascode to support the function of P13. Similarly, MVBP4 is configured as a cascode to support the function of P12. Finally, if no current is enabled the structure at the right of the output driver turns off the output current $I_{OUT}\_N$. This structure includes level shifter 406, inverters SIV4 and SIV5, and transistors MVBP10, MVBP9 and MVBN0.

The configuration of DAC cell 400 as shown in FIG. 4A distributes and balances the current flow through the components of DAC cell 400 as well as supports the feedback loop for the regulated cascode configuration. The configuration of DAC_cell enable unit A (402) and DAC_cell enable unit B (404) is an example of local current mirroring within DAC cell 400 to further multiply and distribute local copies of the input current $I_{IN\_N}$. DAC_cell enable unit B (404) is a scaled version of DAC_cell enable unit A (402) with smaller transistors that carry less current than DAC_cell enable unit A (402). In the example of FIG. 4A, the transistors within DAC_cell enable unit A (402) may be five times larger than those in DAC_cell enable unit B (404). Similarly, the proportions between M1 and M2 and between P12 and P13 may be substantially the same as the scaling between DAC_cell enable unit A (402) and DAC_cell enable unit B (404). In other words, M1 may be five times larger than M2 and P12 may be five times larger than P13. This scaling of these components may allow the regulation loop to properly match the drain voltage between P12 and P11, yet use lower current. The advantage of scaling the local mirror configuration shown in DAC_cell 400 may include reducing the amount of current required for proper circuit function. The scaling factor of five-to-one is just one example. Other scaling factors may include eight-to-one, ten-to-one, or other values.

In other examples, DAC_cell enable unit B (404) may be substantially a copy of DAC_cell enable unit A (402), which would be a one-to-one scaling factor. The configuration of DAC_cell enable unit A (402) and DAC_cell enable unit B (404) may distribute the current through DAC_cell 400 to reduce the amount of current that flows through each component and allow the use of low voltage components. However, examples where DAC_cell enable unit B (404) carries the same current as DAC_cell enable unit A (402) may consume more current than the scaled example of FIG. 4A.

Continuing the example described above for FIG. 1B, with each DAC control signal having a thermometer or unary coding scheme with M+1 lines, then each DAC control signal would include M+2 different levels. Therefore, each DAC_cell may output different current levels based on the DAC control signals ($EN_0$-$EN_N$). In an example with M+1=15, the current(s) flowing to the output driver can be adjusted in sixteen steps. This includes where $EN_N$=0 to $EN_N$=15. In some examples, state0, where $EN_N$=0, may be zero current. As one example, with current switching arrangement 410 as a one-to-one mirror, and the P11/P12 ratio is a multiplier of 20, for an input current $I_{IN\_N}$=2 mA the maximum output current for a controllable current drive state is $$Iout\_N = 2\text{ mA} * 15 * 20 = 600\text{ mA}.$$

Therefore, a current-source unit with eight DAC cells (e.g. DAC_0-DAC_7) would deliver a maximum I_OUT=8*Iout_N=8*600 mA=4.8 A. The output current when the hard_on input is asserted may be greater because hard_on sets a low ohmic connection to the supply.

Figure 4B:
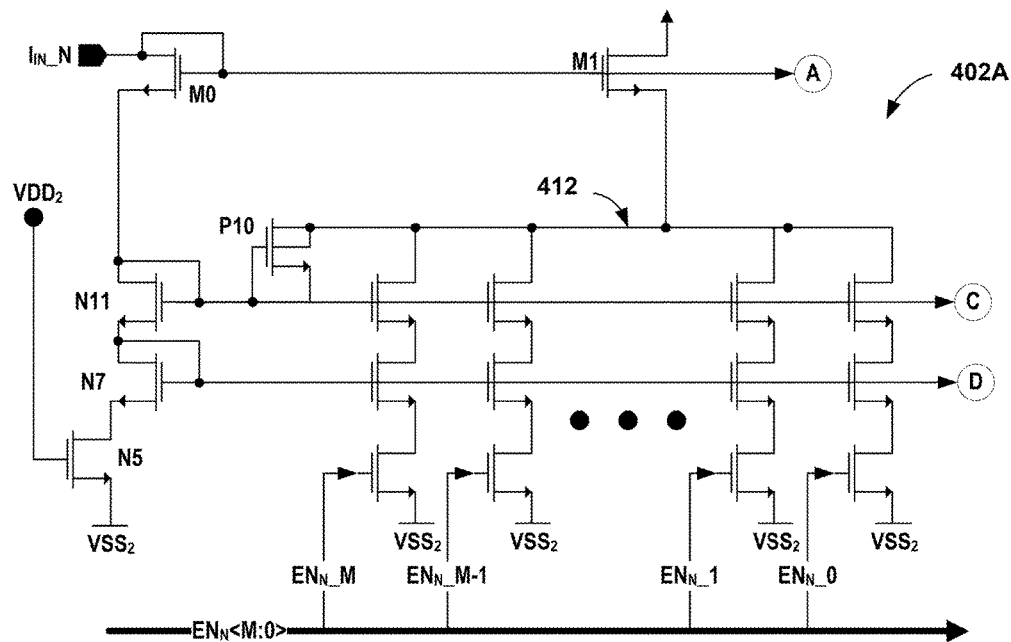
FIGS. 4B and 4C are conceptual and schematic block diagram illustrating further details of example enable control units included in the example DAC cell in accordance with one or more techniques of this disclosure.
Figure 4C:
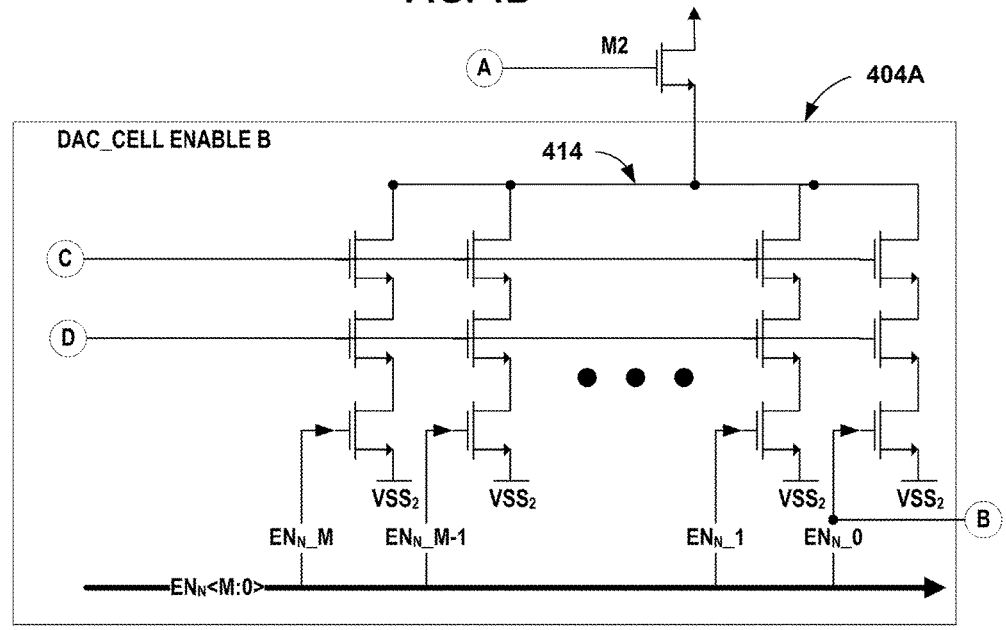

FIGS. 4B and 4C are conceptual and schematic block diagram illustrating further details of example enable control units included in the example DAC cell in accordance with one or more techniques of this disclosure. DAC_cell enable unit B, in this example, is a scaled copy of the local current mirror of DAC_cell enable unit A. The examples of FIGS. 4B and 4C depict transistor stacks configured with two cascode devices. FIGS. 4B and 4C are merely two possible implementations of a DAC_cell enable unit. Other examples of DAC_cell enable units, as used in a current-source unit, may have a single transistor local current mirror with no cascode. Similarly, examples of DAC_cell enable units may have three, four or more cascode transistors in a transistor stack.

FIG. 4B illustrates an example input current terminal and DAC_cell enable unit A. The current through DAC_cell enable unit A, may be up-scaled or multiplied by a factor of that depends on the proportion between the transistors N5, N7 and N11 compared to the transistors in the transistor stack EN_0-EN_M. A scaled proportion of the current through DAC_cell 400 flows through DAC_cell enable unit B. The current from DAC_cell enable unit A flows through M1 and further to P12 to be multiplied again and output through M10 as DAC_cell output current, $I_{OUT}\_N$.

Input current, $I_{IN\_N}$ connects to the drain of M0. The drain of M0 connects to the drain of N11. The source of N11 connects to the drain of N7 and the source of N7 connects to drain of N5. The gate of N5 connects to VDD2 and the source of N5 connects to ground (VSS2). In some examples, the value of VDD2 may be different than the value of VDD3 shown in FIG. 4A.

Each of the control lines $EN_N\_M$-$EN_N\_0$ connects to the gate of the first transistor in a transistor stack of DAC_cell enable unit A. As shown in the example of FIGS. 4B and 4C, a transistor stack includes three transistors with the source of the first connected to ground (VS S2). The drains of the first transistors connect to the source of the second transistors. Similarly, the source of the third transistor connects to the drain of the second transistor while the drain of the third transistor connects to an output bus 412. Output bus 412 connects to the source of M1. The gates of all the second transistors in each transistor stack connect to each other and to the gate of N7. Similarly, the gates of each third transistor in each transistor stack, of both DAC_cell enable unit A and DAC_cell enable unit B, connect to the gate of N11. The gate and source of P10 also connects to the gate of N11 while the body and drain of P10 connects to output bus 412. P10 is configured as a protection device and in some examples may be omitted.

In operation, for example when $EN_N\_1$ is asserted for DAC_cell enable unit A, the scaled mirror of $EN_N\_1$ is also asserted for DAC_cell enable unit B. Therefore, current flows through both transistor stacks for $EN_N\_1$. The current through the transistor stack in DAC_cell enable unit B will be a scaled version of the current through the transistor stack in DAC_cell enable unit A.

FIG. 4C depicts DAC_cell enable unit B, which is configured similar to DAC_cell enable unit A. The output bus 414 of DAC_cell enable unit B connects to the source of M2. This allows current flowing through DAC_cell enable unit B to flow through M2 and further to P13 to support the regulated cascode loop, as described above.

The gates of the third transistors in the transistor stack also connect to the gate of N11, as shown by C. Similarly, the gates of the second transistors connect to the gate of N7, as shown by D. DAC_cell enable unit B also connects $EN_N\_0$ to input A of level shifter 406, as shown in FIG. 4A. The inputs $EN_N\_M$-$EN_N\_0$ come from the DAC logic cell, as described above in FIG. 1B.

Figure 5:
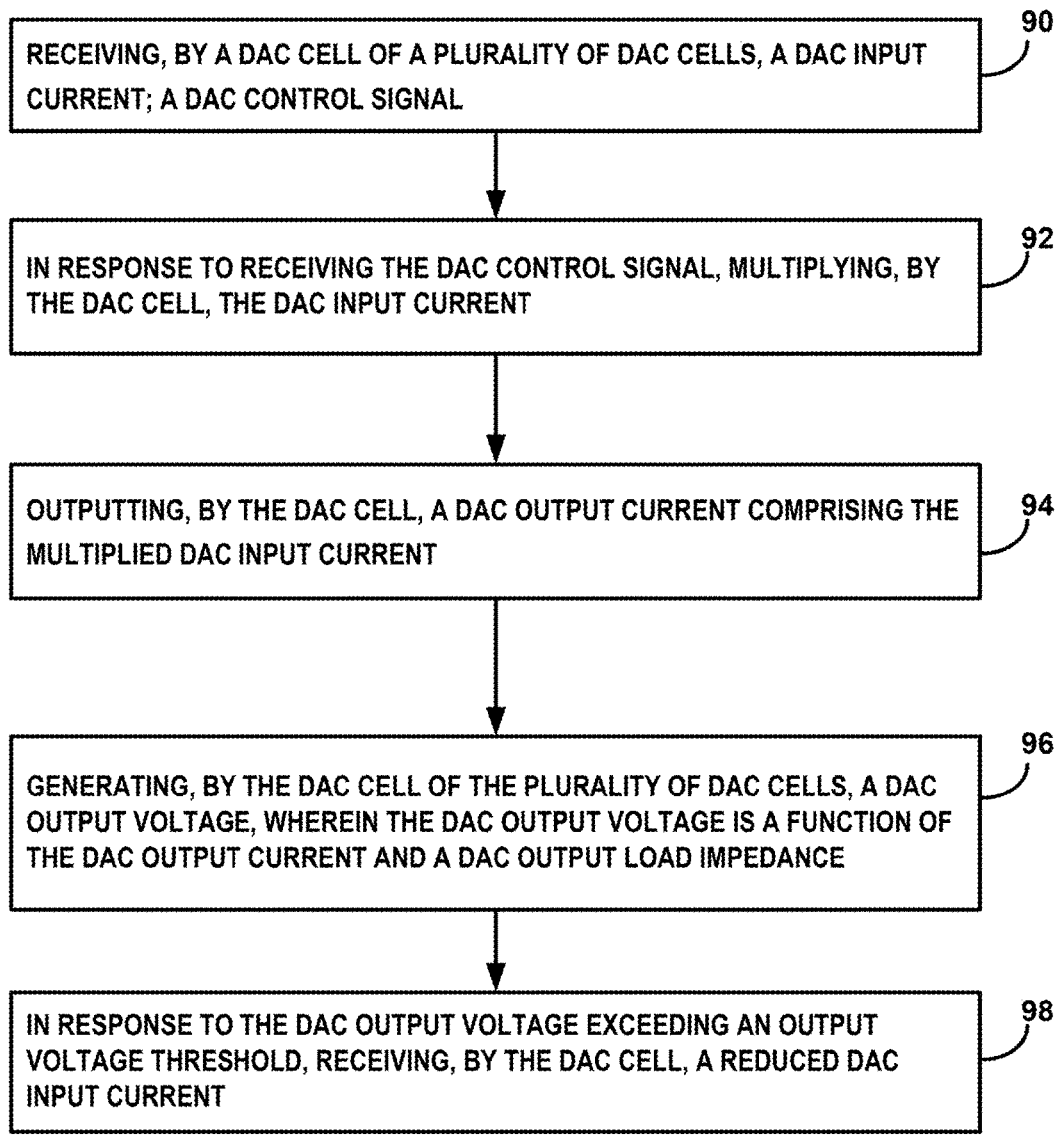
FIG. 5 is a flow chart illustrating an example mode of operation of a current-source unit, in accordance with one or more techniques of this disclosure.

FIG. 5 is a flow chart illustrating an example mode of operation of a current-source unit, in accordance with one or more techniques of this disclosure. The techniques of FIG. 5 will be described in terms of current-source unit 120 depicted in FIG. 1B.

DAC cell (135) of the plurality of DAC cells DAC_0-DAC_N may receive a DAC input current $I_{IN\_N}$ and DAC control signal $EN_N$ (90). DAC control signal $EN_N$ may come from DAC_logic unit 126 and may be a binary coded signal, or some other code scheme, as described above.

In response to receiving the DAC control signal, DAC cell DAC_N may multiply input current $I_{IN\_N}$ (92). Continuing the example as described above for DAC cell 400, DAC cell DAC_N may multiply the input current by a factor that depends on the ratio of P12/P11. In some examples this multiplication factor may be five, twelve, twenty or some other value. As in the example above where the DAC control signal includes sixteen levels, a DAC cell may further multiply the input signal by a factor of up to fifteen. As described above, in other examples DAC control signal $EN_N$ may have more than sixteen or fewer than sixteen levels. Also, the actual multiplication factor depends on the scaling factor of the transistors within DAC_cell enable unit A and B, as described above.

DAC cell DAC N may output a DAC output current, $I_{OUTN}$, which is made up of the multiplied DAC input current $I_{IN\_N}$ (94). The value of DAC output current $I_{OUTN}$ may depend on the value of the DAC control signal $EN_N$.

The overall output current I_out from current-source unit 120 may be increased again by a factor of up to N, where N is the number of DAC cells. I_out is the sum of the DAC output currents from the N DAC cells. Current-source 120 may be configured to balance the current through each DAC of the plurality of DACs (130-135) such that the output currents from each DAC_cell ($I_{OUT0}$-$I_{OUTN}$) are approximately equal to each other. However, output current $I_{OUTN}$ from DAC cell DAC_N may be different than the output current from another DAC.

As a result of outputting an output current $I_{OUTN}$, DAC cell DAC_N may generate a DAC output voltage (96). The DAC output voltage may depend on the DAC output current and the load impedance at output 24. Current-source unit 120 may combine all the DAC outputs at output 24 and monitor the output voltage Vg, which may connect to a power module control input, such as gate 32. The DAC output load impedance is a function of the load impedance at output 24, in the example of FIG. 1B.

In response to the DAC output voltage exceeding an output voltage threshold, DAC cell DAC_N may receive a reduced DAC input current $I_{IN\_N}$ (98). As described above, I_gen unit 122 may monitor the output voltage Vg of current-source unit 120. If Vg exceeds an output voltage threshold, I_gen unit 122 may reduce reference current I_gen_OUT. This may cause P_mirror unit 124 to output a reduced current, $I_{IN\_N}$, to DAC cell DAC_N.

Example 1

A system comprising: a power module that includes a power module control input; a current-source unit configured to deliver a signal to the power module control input, wherein: the current-source unit comprises a digital to analog converter (DAC), the signal comprises an electric current profile, wherein the electric current profile controls the output of the power module.

Example 2

The system of example 1, wherein the current-source unit further comprises: a reference current generation unit, wherein the reference current generation unit is configured to monitor a current-source unit output voltage (Vg) at the power module control input; a current-mirror unit, wherein the current-mirror unit receives a reference current from the reference current generation unit; a plurality of digital-to-analog converter (DAC) cells, wherein each DAC cell of the plurality of DAC cells: receives a DAC input current from the current-mirror unit; and outputs a DAC output current to the power module control input; and a DAC logic unit, wherein the DAC logic unit controls the DAC output current of each DAC cell of the plurality of DAC cells.

Example 3

The system of examples 1 or 2 or combinations thereof, wherein the current-source unit is configured to balance the DAC output current from each DAC cell of the plurality of DAC cells such that each DAC output current is approximately equal.

Example 4

The system of any of examples 1-3 or combinations thereof, wherein the reference current generation unit is further configured to reduce the reference current in response to the current-source unit output voltage (Vg) exceeding an output voltage threshold.

Example 5

The system of any of examples 1-4 or combinations thereof, wherein the power module control input comprises a gate and the power module comprises an insulated-gate bipolar transistor (IGBT).

Example 6

The system of any of examples 1-5 or combinations thereof, wherein the DAC logic unit is configured to receive a code input, wherein the code input controls the system output current from the system output.

Example 7

The system of any of examples 1-6 or combinations thereof, further comprising a hard_off input, and in response to activating the hard_off input, the current-source unit will deliver substantially zero output current to the power module control input.

Example 8

The system of any of examples 1-7 or combinations thereof, further comprising a hard_on input, and in response to activating the hard_on input, the current-source unit will deliver a maximum output current to the power module control input.

Example 9

The system of any of examples 1-8 or combinations thereof, wherein each DAC cell of the plurality of DAC cells comprises a plurality of low voltage transistors protected by a high voltage transistor.

Example 10

A method comprising: receiving, by a DAC cell of a plurality of DAC cells: a DAC input current; a DAC control signal; in response to receiving the DAC control signal, multiplying, by the DAC cell, the DAC input current; and outputting, by the DAC cell, a DAC output current comprising the multiplied DAC input current, wherein the DAC cell comprises a plurality of low voltage transistors protected by a high voltage transistor.

Example 11

The method of example 10, further comprising: generating, by the DAC cell of the plurality of DAC cells, a DAC output voltage, wherein the DAC output voltage is a function of the DAC output current and a DAC output load impedance; and in response to the DAC output voltage exceeding an output voltage threshold, receiving, by the DAC cell, a reduced DAC input current.

Example 12

A current-source circuit comprising: a circuit output terminal including a circuit output voltage (Vg) and a circuit output current; a reference current generation unit, wherein the reference current generation unit is configured to monitor the circuit output voltage (Vg); a current-mirror unit, wherein the current-mirror unit receives a reference current from the reference current generation unit; a plurality of digital-to-analog converter (DAC) cells, wherein each DAC cell of the plurality of DAC cells: receives a DAC input current from the current-mirror unit; and outputs a DAC output current to the circuit output terminal; and a DAC logic unit, wherein the DAC logic unit controls the DAC output current of each DAC cell of the plurality of DAC cells.

Example 13

The current-source circuit of example 12, wherein the current-source circuit is configured to balance the DAC output current from each DAC cell of the plurality of DAC cells such that each DAC output current is approximately equal.

Example 14

The current-source circuit of any of examples 12-13 or combinations thereof, wherein the reference current generation unit is further configured to reduce the reference current in response to the circuit output voltage exceeding an output voltage threshold.

Example 15

The current-source circuit of any of examples 12-14 or combinations thereof, wherein the DAC logic unit is configured to receive a code input, wherein the code input controls the circuit output current.

Example 16

The current-source circuit of any of examples 12-15 or combinations thereof, further comprising a hard_off input, and in response to activating the hard_off input, the circuit output current will be substantially zero output current.

Example 17

The current-source circuit of any of examples 12-16 or combinations thereof, further comprising an off-current input, and in response to receiving the off-current input, the circuit output current will be substantially zero output current.

Example 18

The current-source circuit of any of examples 12-17 or combinations thereof, further comprising a hard_on input, and in response to activating the hard_on input, the circuit output current will be a maximum circuit output current.

Example 19

The current-source circuit of any of examples 12-18 or combinations thereof, wherein each DAC cell of the plurality of DAC cells comprises a plurality of low voltage transistors protected by a high voltage transistor.

Example 20

The current-source circuit of any of examples 12-19 or combinations thereof, wherein the system comprises a current steering DAC topology.

Various embodiments of the disclosure have been described. These and other embodiments are within the scope of the following claims.

The invention claimed is:
1. A system comprising:
a power module that includes a power module control input; and
a current-source unit configured to deliver a signal to the power module control input, wherein:
the current-source unit comprises:
a reference current generation unit, wherein the reference current generation unit is configured to monitor a current-source unit output voltage (Vg) at the power module control input;
a current-mirror unit, wherein the current-mirror unit receives a reference current from the reference current generation unit;
a plurality of digital-to-analog converter (DAC) cells, wherein each DAC cell of the plurality of DAC cells receives a DAC input current from the current-mirror unit and outputs a DAC output current to the power module control input; and
a DAC logic unit, wherein the DAC logic unit controls the DAC output current of each DAC cell of the plurality of DAC cells;
the signal comprises an electric current profile, and
the electric current profile controls the output of the power module.

2. The system of claim 1, wherein the current-source unit is configured to balance the DAC output current from each DAC cell of the plurality of DAC cells such that each DAC output current is approximately equal.

3. The system of claim 1, wherein the reference current generation unit is further configured to reduce the reference current in response to the current-source unit output voltage (Vg) exceeding an output voltage threshold.

4. The system of claim 1, wherein the power module control input comprises a gate and the power module comprises an insulated-gate bipolar transistor (IGBT).

5. The system of claim 1, wherein the DAC logic unit is configured to receive a code input, wherein the code input controls the system output current from the system output.

6. The system of claim 1, further comprising a hard_off input, and in response to activating the hard_off input, the current-source unit will deliver substantially zero output current to the power module control input.

7. The system of claim 1, further comprising a hard_on input, and in response to activating the hard_on input, the current-source unit will deliver a maximum output current to the power module control input.

8. The system of claim 1, wherein each DAC cell of the plurality of DAC cells comprises a plurality of low voltage transistors protected by a high voltage transistor.

9. A method comprising:
receiving, by a DAC cell of a plurality of DAC cells:
a DAC input current; and
a DAC control signal;
in response to receiving the DAC control signal, multiplying, by the DAC cell, the DAC input current; and
outputting, by the DAC cell, a DAC output current comprising the multiplied DAC input current,
wherein the DAC cell comprises a plurality of low voltage transistors protected by a high voltage transistor.

10. The method of claim 9, further comprising:
generating, by the DAC cell of the plurality of DAC cells, a DAC output voltage, wherein the DAC output voltage is a function of the DAC output current and a DAC output load impedance; and
in response to the DAC output voltage exceeding an output voltage threshold, receiving, by the DAC cell, a reduced DAC input current.

11. A current-source circuit comprising:
a circuit output terminal including a circuit output voltage (Vg) and a circuit output current;
a reference current generation unit, wherein the reference current generation unit is configured to monitor the circuit output voltage (Vg);
a current-mirror unit, wherein the current-mirror unit receives a reference current from the reference current generation unit;
a plurality of digital-to-analog converter (DAC) cells, wherein each DAC cell of the plurality of DAC cells:
receives a DAC input current from the current-mirror unit; and
outputs a DAC output current to the circuit output terminal; and
a DAC logic unit, wherein the DAC logic unit controls the DAC output current of each DAC cell of the plurality of DAC cells.

12. The current-source circuit of claim 11, wherein the current-source circuit is configured to balance the DAC output current from each DAC cell of the plurality of DAC cells such that each DAC output current is approximately equal.

13. The current-source circuit of claim 11, wherein the reference current generation unit is further configured to reduce the reference current in response to the circuit output voltage exceeding an output voltage threshold.

14. The current-source circuit of claim 11, wherein the DAC logic unit is configured to receive a code input, wherein the code input controls the circuit output current.

15. The current-source circuit of claim 11, further comprising a hard_off input, and in response to activating the hard_off input, the circuit output current will be substantially zero output current.

16. The current-source circuit of claim 11, further comprising an off-current input, and in response to receiving the off-current input, the circuit output current will be substantially zero output current.

17. The current-source circuit of claim 11, further comprising a hard_on input, and in response to activating the hard_on input, the circuit output current will be a maximum circuit output current.

18. The current-source circuit of claim 11, wherein each DAC cell of the plurality of DAC cells comprises a plurality of low voltage transistors protected by a high voltage transistor.

19. The current-source circuit of claim 11, wherein the current-source circuit comprises a current steering DAC topology.

20. A system comprising:
a power module that includes a power module control input;
a current-source unit configured to deliver a signal to the power module control input, wherein:
the current-source unit comprises a digital to analog converter (DAC),
the signal comprises an electric current profile, and
the electric current profile controls the output of the power module; and
a reference current generation unit, wherein the reference current generation unit is configured to:

monitor a current-source unit output voltage (Vg) at the power module control input, and
reduce the reference current in response to Vg exceeding an output voltage threshold.

21. A system comprising:
a power module that includes a power module control input;
a current-source unit configured to deliver a signal to the power module control input, wherein:
the current-source unit comprises a digital to analog converter (DAC),
the signal comprises an electric current profile, and
the electric current profile controls the output of the power module; and
a hard_off input, and in response to activating the hard_off input, the current-source unit will deliver substantially zero output current to the power module control input.

22. A system comprising:
a power module that includes a power module control input;
a current-source unit configured to deliver a signal to the power module control input, wherein:
the current-source unit comprises a digital to analog converter (DAC),
the signal comprises an electric current profile, and
the electric current profile controls the output of the power module; and
a hard_on input, and in response to activating the hard_on input, the current-source unit will deliver a maximum output current to the power module control input.

* * * * *